United States Patent
Wienhold et al.

(10) Patent No.: US 10,915,084 B2
(45) Date of Patent: Feb. 9, 2021

(54) FIELD DEVICE SWITCH MONITOR

(71) Applicant: Rosemount Inc., Shakopee, MN (US)

(72) Inventors: Nicholas Aaron Wienhold, Waconia, MN (US); Justin Tai Zingsheim, Chaska, MN (US)

(73) Assignee: ROSEMOUNT INC., Shakopee, MN (US)

(*) Notice: Subject to any disclaimer, the term of this patent is extended or adjusted under 35 U.S.C. 154(b) by 0 days.

(21) Appl. No.: 15/918,226

(22) Filed: Mar. 12, 2018

(65) Prior Publication Data
US 2019/0278244 A1 Sep. 12, 2019

(51) Int. Cl.
*G05B 19/048* (2006.01)
*G01R 31/327* (2006.01)
(Continued)

(52) U.S. Cl.
CPC ....... *G05B 19/048* (2013.01); *G01R 31/3277* (2013.01); *G05B 19/0425* (2013.01); *H01H 47/002* (2013.01); *G05B 2219/1181* (2013.01); *G05B 2219/21163* (2013.01); *G05B 2219/24015* (2013.01); *G05B 2219/25191* (2013.01); *G05B 2219/25428* (2013.01)

(58) Field of Classification Search
None
See application file for complete search history.

(56) References Cited

U.S. PATENT DOCUMENTS 3,696,364 A * 10/1972 Lavelle ................ H01H 47/002
340/531
5,436,788 A * 7/1995 Wallaert ............ H02J 13/00009
361/160

(Continued)

FOREIGN PATENT DOCUMENTS

EP 0 948 759 10/1999
EP 2 063 278 5/2009

OTHER PUBLICATIONS

Product Data Sheet, Rosemount 2120 Level Switch-Vibrating Fork, 00813-0100-04030, Rev. HC, Dec. 2017, 24 pgs.
(Continued)

*Primary Examiner* — Mohammad Ali
*Assistant Examiner* — David Earl Ogg
(74) *Attorney, Agent, or Firm* — Westman, Champlin & Koehler, P.A.

(57) ABSTRACT

An industrial process field device includes an active component, a switch, a switch monitor, and a controller. The active component may be a sensor configured to sense a process parameter, or a control device configured to control a process of the industrial process. The switch is electrically coupled to first and second terminals and is configured to electrically connect the first and second terminals when in a closed state, and electrically disconnect the first and second terminals when in an open state. The switch monitor is configured to detect a current state of the switch corresponding to the closed or open state, and generate a state output indicating the current state. The controller is configured to set the switch in the open or closed state, and generate a notification based on the state output that indicates at least one of the current state of the switch and a condition of the switch.

20 Claims, 5 Drawing Sheets

(51) Int. Cl.
*H01H 47/00* (2006.01)
*G05B 19/042* (2006.01)

(56) References Cited

U.S. PATENT DOCUMENTS

| | | | | |
|---|---|---|---|---|
| 2002/0149371 A1* | 10/2002 | Grassmann | ............ | H01H 1/605 |
| | | | | 324/422 |
| 2010/0181179 A1* | 7/2010 | Bou | .................... | H02J 13/0017 |
| | | | | 200/5 A |
| 2016/0109871 A1* | 4/2016 | Phillips | ................ | G05D 7/0676 |
| | | | | 700/83 |
| 2016/0377306 A1* | 12/2016 | Drees | .................... | G05B 15/02 |
| | | | | 700/295 |
| 2018/0024195 A1* | 1/2018 | Takamura | ............ | G01R 31/327 |
| | | | | 324/380 |
| 2019/0066938 A1* | 2/2019 | Ishida | .................... | H01H 1/605 |

OTHER PUBLICATIONS

U.S. Appl. No. 15/928,449, filed Mar. 22, 2018.
E-Direct Produktkatalog 2016-2017, Endress+Hauser, Part 1, Jan. 1, 2016, pp. 1-84.
E-Direct Produktkatalog 2016-2017, Endress+Hauser, Part 2, Jan. 1, 2016, pp. 85-168.
E-Direct Produktkatalog 2016-2017, Endress+Hauser, Part 3, Jan. 1, 2016, pp. 169-180.
Notification of Transmittal of the International Search Report and the Written Opinion of the International Searching Authority, from PCT/US2019/015556, dated Apr. 18, 2019.
Communication Pursuant to Rules 161(1) and 162 EPC from European Patent Application No. 19705438.0, dated Oct. 20, 2020.

\* cited by examiner

FIELD DEVICE SWITCH MONITOR

BACKGROUND

Embodiments of the present disclosure relate to industrial process control systems. More specifically, embodiments of the present disclosure relate to an industrial process field device having a switch monitor for monitoring a state of a switch of the field device.

In industrial settings, control systems are used to monitor and control inventories of industrial and chemical processes, and the like. Typically, the control system performs these functions using industrial process field devices distributed at key locations in the industrial process and coupled to the control circuitry in the control system by a process control loop. The term "field device" refers to any device that performs a function in a distributed control or process monitoring system, including all devices currently known, or yet to be known, that are used in the measurement, control, and/or monitoring of industrial processes.

Typical field devices include device circuitry that enables the field device to perform conventional field device tasks such as process parameter monitoring and measurements using one or more sensors, and/or process control operations using one or more control devices. Exemplary sensors include pressure sensors, level sensors, temperature sensors, and other sensors used in industrial processes. Exemplary control devices include actuators, solenoids, valves, and other control devices.

The device circuitry of field devices may also include a controller that is used to control the sensors and/or control devices, and communicate with a process control system, or other circuitry, over a process control loop, such as a 4-20 mA process control loop, for example. In some installations, the process control loop is used to deliver a regulated current and/or voltage to the field device for powering the field device. The process control loop can also carry data, such as a process parameter value corresponding to a sensed process parameter. This data may be communicated over the process control loop as an analog signal, or as a digital signal.

SUMMARY

Embodiments of the present disclosure are directed to field devices for an industrial process, industrial process control systems, and methods of controlling an external device using an industrial process field device. One embodiment of the field device includes an active component, a switch, a switch monitor, and a controller. The active component may be a sensor configured to sense a process parameter, or a control device configured to control a process of the industrial process. Preferably, the switch is electrically coupled to first and second terminals and is configured to electrically connect the first and second terminals when in a closed state, and electrically disconnect the first and second terminals when in an open state. The switch monitor is configured to detect a current state of the switch corresponding to the closed state or open state, and generate a state output indicating the current state. The controller is configured to set the switch in the open or closed state, and generate a notification based on the state output that indicates at least one of the current state of the switch and a condition of the switch.

One embodiment of the industrial process control system includes the above-described field device, an external device, and a power supply. The external device is electrically coupled to the switch through the first terminal. The power supply is electrically coupled to the switch through the second terminal, and is configured to power the external device through the switch. Power is supplied to the external device when the switch is in the closed state, and power is disconnected from the external device when the switch is in the open state.

In one embodiment of the method, a process parameter of an industrial process is sensed, or the industrial process is controlled using an active component of the field device. A switch of the field device is set to a current state corresponding to an open state, in which electrical power from an external power supply is disconnected from the external device, or a closed state, in which electrical power from the external power supply is connected to the external device, using a switch drive signal generated by a controller of the field device. An electrical parameter indicating the current state of the switch is detected using a switch monitor of the field device. A state output indicating the current state is generated based on the detected electrical parameter using the switch monitor. A notification is generated based on the state output using the controller that indicates at least one of the current state of the switch and a condition of the switch.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

DETAILED DESCRIPTION OF ILLUSTRATIVE EMBODIMENTS

Figure 1:
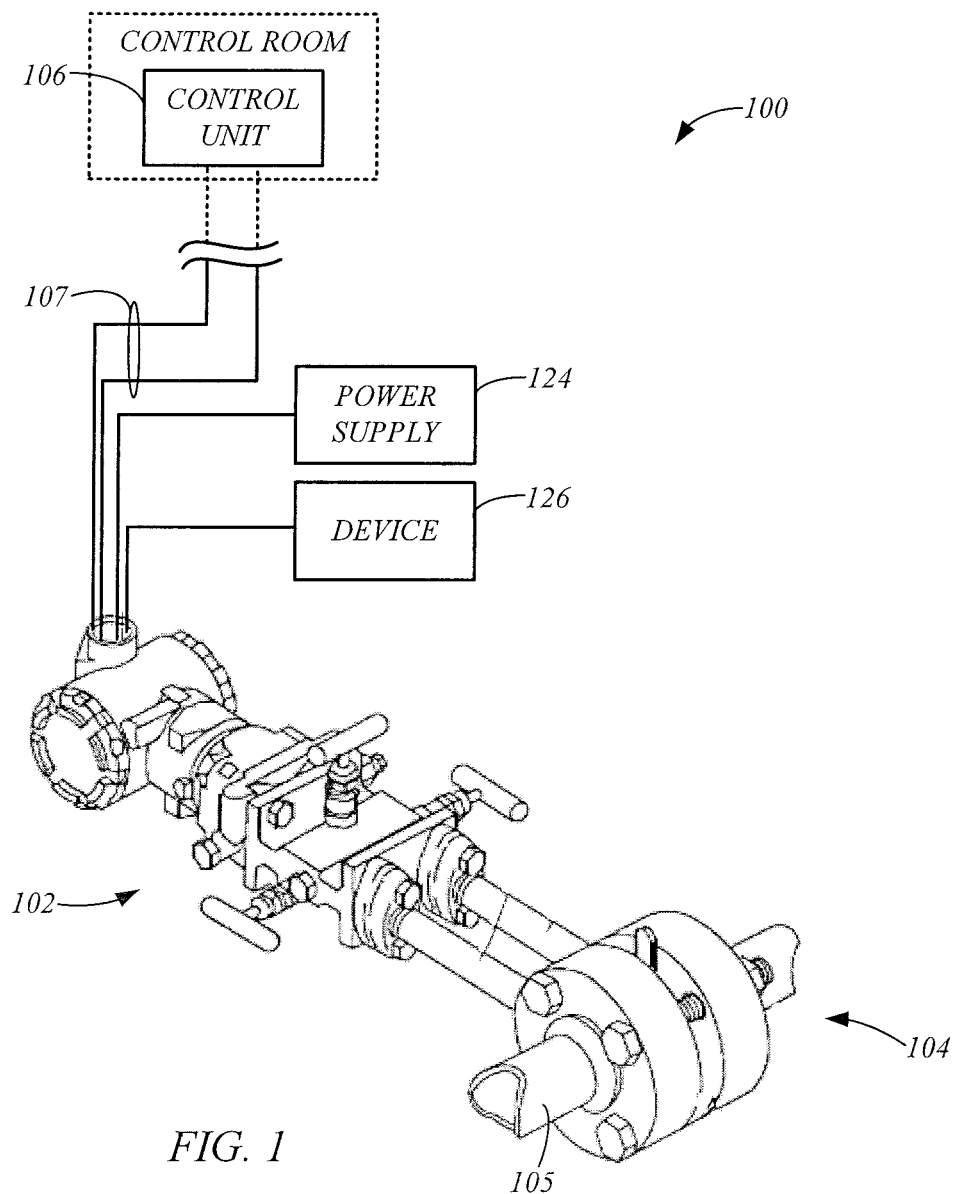
FIGS. 1 and 2 are simplified diagrams of exemplary process control systems, in accordance with embodiments of the present disclosure.

Embodiments of the present disclosure are described more fully hereinafter with reference to the accompanying drawings. Elements that are identified using the same or similar reference characters refer to the same or similar elements. The various embodiments of the present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art.

Figure 2:
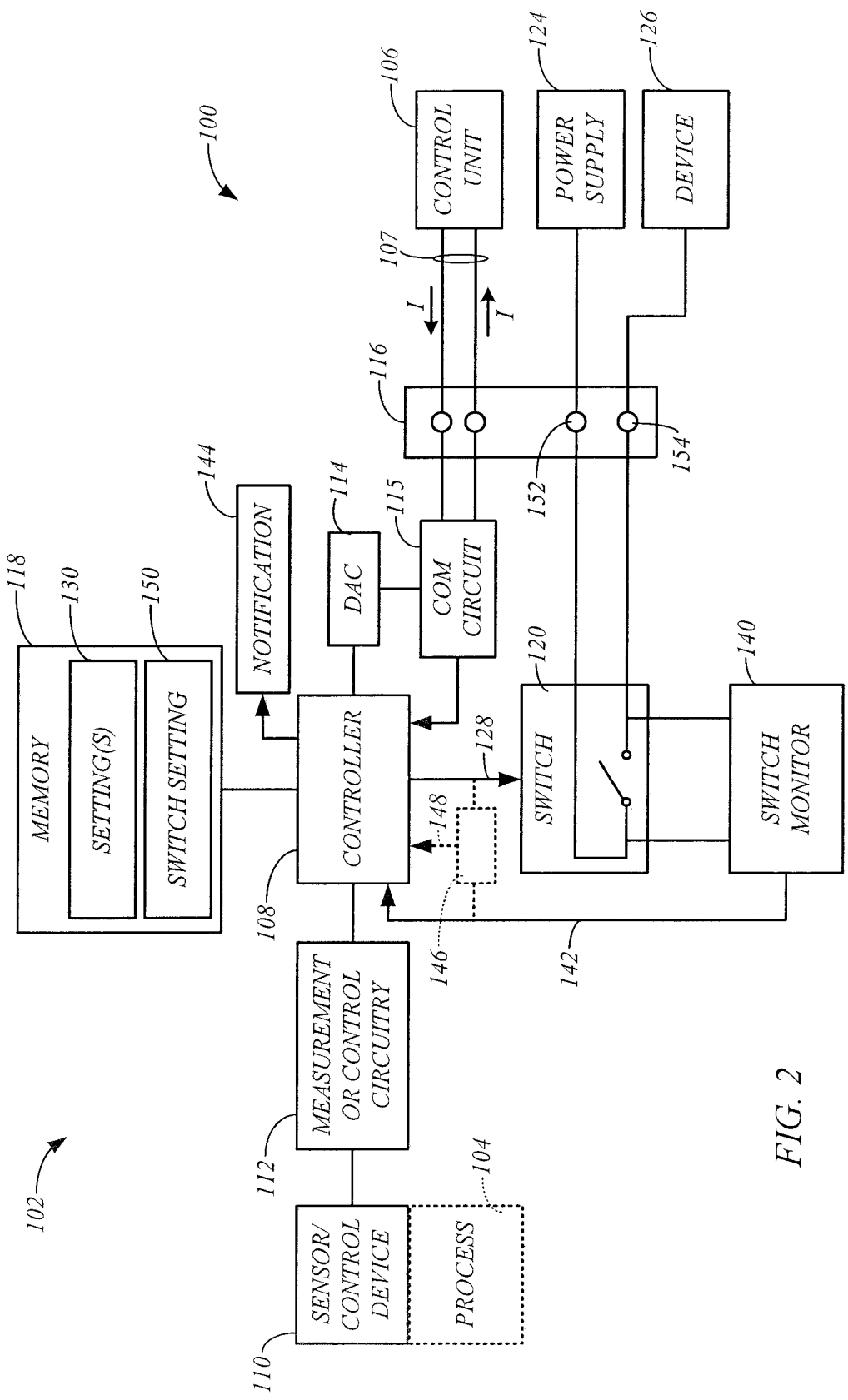

Embodiments of the present disclosure are generally directed to industrial process field devices, industrial process control systems that include the field device, and methods of controlling an external device using the field device. FIGS. 1 and 2 are simplified diagrams of exemplary process measurement or control systems 100, in accordance with embodiments of the present disclosure.

The system 100 includes an industrial process field device 102 that may interact with an industrial process 104. In some embodiments, the process 104 involves a material, such as a fluid, transported though pipes, such as pipe 105 (FIG. 1), and/or contained in tanks, for example, that is processed by the system 100. This processing of the material generally transforms the material from a less valuable state into more valuable and useful products, such as petroleum, chemicals, paper, food, etc. For example, an oil refinery performs industrial processes that can process crude oil into gasoline, fuel oil, and other petrochemicals.

The field device 102 may communicate with a computerized control unit 106 that may be configured to control the field device 102. The control unit 106 may be remotely located from the field device, such as in a control room for the system 100, as shown in FIG. 1.

The control unit 106 may be communicatively coupled to the field device 102 over a suitable physical communication link or a wireless communication link. For example, the control unit may be coupled to the field device over a control loop 107. Communications between the control unit 106 and the field device 102 may be performed over the control loop 107 in accordance with conventional analog and/or digital communication protocols. In some embodiments, the process control loop 107 includes a 4-20 milliamp process control loop, in which a process variable may be represented by a level of a loop current I (FIG. 2) flowing through the process control loop 107. Exemplary digital communication techniques include digital signals that are modulated onto the analog current level of the two-wire process control loop 107, such as the HART® communication standard. Other purely digital techniques may also be employed including FieldBus and Profibus communication protocols. The control unit 106 may include a power source that powers the field device 102 over the control loop 107.

In some embodiments, the field device 100 includes a controller 108, an active component in the form of one or more sensors or control devices 110, measurement or control circuitry 112, a digital-to-analog converter (DAC) 114, a communications circuit 115, and/or a terminal block 116, as shown in the simplified diagram of FIG. 2. The controller 108 may represent one or more processors (i.e., microprocessor, central processing unit, etc.) that control components of the field device 100 to perform one or more functions described herein in response to the execution of instructions, which may be stored locally in non-transitory, patent subject matter eligible, computer readable media or memory 118 of the device 100. In some embodiments, the processors of the controller 108 are components of one or more computer-based systems. In some embodiments, the controller 108 includes one or more control circuits, microprocessor-based engine control systems, one or more programmable hardware components, such as a field programmable gate array (FPGA), that are used to control components of the device 100 to perform one or more functions described herein. The controller 108 may also represent other conventional field device circuitry.

The field device 102 may be used to sense or measure a parameter of the process 104, such as a temperature, a level, a pressure, a flow rate, or another parameter of the process 104 using one or more sensors represented by block 110 in FIG. 2. Exemplary sensors 110 include pressure sensors, temperature sensors, level sensors, flow rate sensors, and/or other sensors used to sense or measure a process parameter.

The field device 100 may also be configured to control an aspect of the process 104 using one or more control devices represented by block 110 in FIG. 2. Exemplary control devices 110 include actuators, solenoids, valves, and other conventional process control devices used in field devices to control a process.

The measurement or control circuitry 112 represents circuitry that interacts with the sensor or the control device 110. For instance, the circuitry 112 may include measurement circuitry that translates an output from a sensor 110 for use by a controller 108 of the field device. The DAC 114 may be used by the controller 108 to convert digital signals into analog signals that are communicated to the control unit 106 using the communications circuit 115, such as over the two-wire process control loop 107 by adjusting the loop current I to indicate a value of a process parameter sensed by the sensor 110, for example. The circuitry 112 may also be used to control a control device 110, such as in response to commands from the control unit 106 or other location that are received by the controller 108 through the communications circuit 115, for example.

Embodiments of the present disclosure are directed to a field device 102 that includes a switch 120. The switch 120 may be electrically coupled to a power supply 124 and a device 126, which are external to the field device 102, such as through the terminal block 116. Thus, embodiments of the power supply 124 and the device 126 are separate from the field device 102. The controller 108 controls the switch 120 to electrically connect or disconnect electrical power from the power supply 124 to the device 126. Exemplary embodiments of the device 126 include, for example, a pump, a compressor, a solenoid, or another device that may be suitable for use with the system 100.

The switch 120 may take on any suitable form. For example, the switch 120 may include a latching relay or another suitable switch. Additionally, while only a single switch 120 is illustrated, it is understood that the field device 102 may include multiple switches 120 that may be coupled to, for example, the terminal block 116, and are each controlled by the controller 108.

In some embodiments, the controller 108 selectively sets (i.e., controls, actuates or toggles) the switch 120 between a closed state, in which the switch 120 connects the device 126 to electrical power from the power supply 124, and an open state in which the switch 120 disconnects the device 126 from the power supply 124. Thus, the device 126 may be activated during or in response to the switch 120 being set to the closed state, and the device 126 is deactivated in response to the switch 120 being set to the open state. In some embodiments, the setting of the state of the switch 120 occurs in response to a switch drive signal 128 from the controller 108.

In some embodiments, the controller 108 is configured to set the switch 120 in either the open or closed state in response to processor-executed instructions based on one or more settings. The settings and programmed instructions may be stored in the memory 118 as settings 130, memory of the control unit 106, and/or stored in another suitable location. The settings 130 may include user-defined settings, such as threshold values and/or other switch control parameters.

In one embodiment, the controller 108 sets the switch 120 in the open or closed state in response to a sensed parameter (e.g., pressure, level, flow, temperature, etc.) detected by the sensor 110. For example, the controller 108 may compare a sensed parameter value output from the circuitry 112 based on a parameter output from the sensor 110 to a setting 130, such as a user-defined threshold value, and set the switch 120 to a predetermined open or closed state using the drive signal 128 when the sensed parameter value meets a predetermined relationship to the threshold value.

Alternatively, the control unit 106 may receive the sensed parameter value from the field device 102, and issue a command to the controller 108, such as over the control loop 107, to set the switch 120 in a desired state, when the sensed parameter value meets a predetermined relationship to a setting 130, such as a user-defined threshold value. The controller 108 then produces the drive signal 128 to set the switch 120 in the desired state in response to the command from the control unit 106.

In one example, the field device 102 may include a level sensor 110 that senses a level in a tank, and communicates the sensed level to the control unit 106 using the communications circuit 115. When the level output generated by the sensor 110 indicates a sensed level that falls below a threshold value (e.g., setting 130), the controller 108 may be configured, or commanded by the control unit 106, to set the switch 120 in the closed state to activate an external pump (device 126) and drive additional material into the tank. After the level sensed by the sensor 110 reaches another threshold level (setting 130), such as one indicating that the tank is full, the controller 108 may be configured or commanded to open the switch 120 and deactivate the pump.

In another embodiment, the controller 108 sets the switch 120 in the open or closed state in response to a state of the control device 110 using the switch drive signal 128. Alternatively, the control unit 106 may issue a command to the controller 108 to set the switch 120 in either the open or closed state based on a state of the control device 110. Here, the control device 110 includes at least two different states, such as, for example, an open or closed state of a valve, a position of an actuator or solenoid, or another state of the control device 110. For example, when the control device 110 is a valve and the device 126 is a pump, the controller 108 may be configured or commanded to set the switch 120 in the closed position when the valve is open to activate the pump and drive a flow of material through the valve, and the controller 108 may be configured or commanded to set the switch 120 to the open position when the valve is closed to deactivate the pump.

It is important that the switch 120 operates properly by achieving the intended open or closed state. An undetected failure of the switch 120 to enter a desired state set by the controller 108 could lead to a multitude of issues including, for example, safety issues, regulatory issues, process quality issues, and other possible issues, that could lead to plant shut-downs and lengthy troubleshooting and repair measures. For example, if the controller 108 sends a drive signal 128 to transition the switch 120 from the closed state to the open state to deactivate a pump (device 126) filling a tank with a fluid, but the switch 120 fails to transition to the open state, the pump may continue to operate, which could result in the fluid overflowing the tank among other potential problematic outcomes. Such switch failures generally require immediate attention to mitigate potential damage. Unfortunately, it would generally be too time consuming and costly to provide sufficient manual supervision of the field devices 102 within an industrial system to identify failed or failing switches 120.

Embodiments of the field device 102 in accordance with the present disclosure includes a switch monitor 140 (FIG. 2) that may be used to verify that the switch 120 of the field device 102 is operating as intended. The switch monitor 140 may be electrically coupled to the power supply 124 and the device 126 through, for example, the terminal block 116, as indicated in FIG. 2. In some embodiments, the switch monitor 140 is configured to handle power supplies 124 that provide a direct current (DC) or a DC voltage, such as 20-60 VDC, or an alternating current (AC) or an AC voltage, such as 20-250 VAC.

In some embodiments, the switch monitor 140 is configured to detect (e.g., sense or measure) a current state (i.e., open or closed) of the switch 120, and generate a state output 142 indicating the current state of the switch 120. The controller 108 is configured to generate a notification 144 based on the state output 142. The notification 144 may be transmitted to the control unit 106 or another location using a wired (e.g., control loop 107) or wireless communication link, using the communications circuit 115, for example.

Embodiments of the notification 144 indicate the current state of the switch 120, and/or whether the switch 120 is operating properly or not (i.e., a condition of the switch 120). The notification 144 may take on any suitable form. Exemplary notifications 144 include or trigger: an alarm (audible and/or visible); a status report presented on a display, such as on a display of the control unit 106; an analog or digital communication or message over a wireless or wired communication link, such as a communication or setting delivered over the process control loop 107; or another notification. For example, the notification 144 may be transmitted using the communications circuit 115 by setting the loop current I to a predetermined level, or one of a plurality of predetermined levels, each of which indicates a different notification.

In some embodiments, the controller 108 generates the notification 144 based on a comparison between the state output 142 and the switch drive signal 128, which sets the state of the switch 120 based on a sensed parameter, a command, and/or a state of a control device, as discussed above. This comparison may be made using a comparator circuit 146 that compares the state output 142 and the switch drive signal 128, and outputs a signal 148 based on the comparison. The signal 148 may indicate a correspondence between the switch drive signal 128 and the state output 142, such as when the switch drive signal 128 is configured to set the switch 120 in the open state and the state output 142 indicates that the switch 120 is in the open state. In this case, the switch 120 is presumed to be operating properly. Alternatively, the signal 148 may indicate a conflict between the switch drive signal 128 and the state output 142, such as when the switch drive signal 128 is configured to set the switch 120 in the open state and the state output 142 indicates that the switch 120 is in the closed position. In this case, the switch 120 is presumed to be operating improperly. The notification 144 may be generated by the controller 108 in response to the signal 148 to indicate the proper or improper operation of the switch 120. Additionally, the notification 144 may indicate the current state of the switch 120 indicated by the switch output 142, and/or the intended state of the switch 120 corresponding to the switch drive signal 128.

In some embodiments, the controller 108 generates the notification 144 based on a comparison between the state output 142 and a switch setting 150, which may be stored in the memory 118, for example, as shown in FIG. 2. The switch setting 150 indicates the intended or desired open or closed state of the switch 120. Thus, the switch setting 150 generally corresponds to the switch drive signal 128 that sets the state of the switch 120, and may be based on a sensed parameter, a state of a control device, and/or a command, as discussed above. The controller 108 determines whether there is correspondence between the switch setting 150 and the state output 142, which indicates that the switch 120 is operating properly, or a conflict between the switch setting 150 and the state output 142, which indicates that the switch 120 is operating improperly. The notification 144 is generated by the controller 108 to indicate the proper or improper operation of the switch 120. Additionally, the notification 144 may indicate the current state of the switch 120 indicated by the switch output 142, and/or the intended state of the switch 120 indicated by the switch setting 150.

In some embodiments, the switch monitor 140 comprises circuitry that detects (i.e., senses or measures) an electrical parameter that indicates the current state (i.e., open or closed) of the switch 120, and generates the state output 142 based on the detected electrical parameter. Embodiments of the electrical parameter include a voltage (AC or DC) across the switch 120, a current (AC or DC) through the switch 120, or another suitable electrical parameter. In some embodiments, the switch monitor 140 generates a state output 142 based on the detected electrical parameter that indicates the current state of the switch 120.

Figure 3:
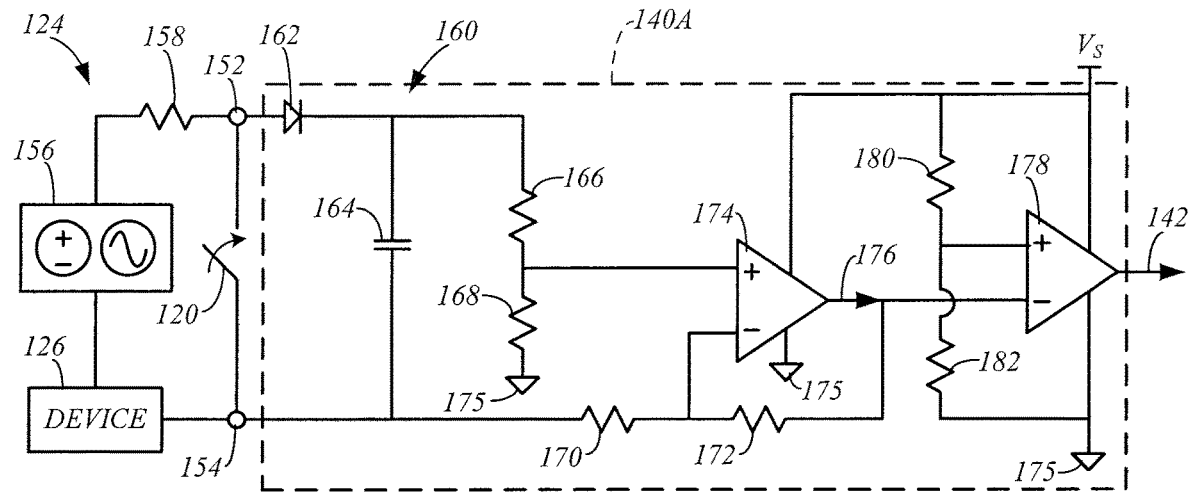
FIGS. 3 and 4 are circuit diagrams of exemplary switch monitors of an industrial process field device, in accordance with embodiments of the present disclosure.
Figure 4:
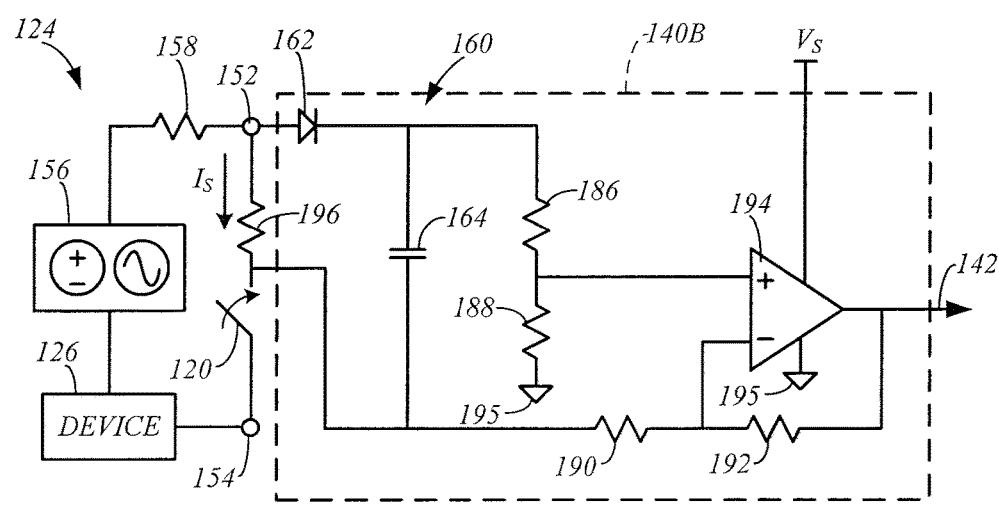

FIGS. 3 and 4 are circuit diagrams of exemplary switch monitors 140A and 140B in accordance with embodiments of the present disclosure. The exemplary switch monitor 140A is configured to produce the state output 142 based on a voltage (AC or DC) across the switch 120, and the exemplary switch monitor 140B is configured to produce the state output 142 (i.e., an analog voltage) based on a current $I_S$ (AC or DC) through the switch 120. The switch monitors 140A and 140B are each coupled to terminals 152 and 154, which may be terminals of the terminal block 116, as shown in FIG. 2. The power supply 124 is generally represented by an AC or DC voltage supply 156 and a resistance 158, which is coupled to the terminal 152. The device 126 is electrically coupled to the terminal 154 and the supply 156 or electrical ground/common.

In some embodiments, the switch monitor 140A includes a voltage rectifier 160 that allows the switch monitor 140A to operate during a negative wave cycle of an AC waveform supplied by the power supply 124. In one exemplary embodiment, the rectifier 160 includes a diode 162 and a capacitor 164. The diode 162 blocks the negative cycle portion of an AC waveform produced by the power supply 124. The capacitor 164 charges during the positive cycle of an AC waveform, and slowly decays during the negative cycle of the AC waveform while the diode 162 is blocking the waveform. The capacitor 164 is appropriately sized to substantially maintain the voltage charge attained during the positive cycle of the AC waveform during the negative cycle of the AC waveform.

The switch monitor 140A may include resistors 166, 168, 170 and 172 and an operational amplifier (op-amp) 174 having a positive power supply input coupled to a supply voltage Vs, and a negative power supply input coupled to electrical ground 175. The ratio of the resistors 166 and 170, and the resistors 168 and 172 set the gain for the op-amp 174 to detect the voltage difference across the switch 120 and between the terminals 152 and 154, which is indicated by output 176. The resistances of the resistors 166, 168, 170 and 172 are high to prevent high currents from flowing through the switch 120 from damaging any low voltage electronics.

The switch monitor 140A also includes an op-amp 178 having a positive power supply input coupled to the supply voltage Vs, and a negative power supply input coupled to electrical ground 175. The op-amp 178 compares the voltage difference across the switch 120 indicated by the output 176 to a threshold voltage, which is set by the voltage divider fanned by resistors 180 and 182, and outputs the state output 142 based on the comparison. The threshold voltage may be adjusted to correctly trigger across the range of voltages being switched by the switch 120.

The state output 142 from the op-amp 178 may be configured to be a logic high for an open or closed state of the switch 120 depending on the application (e.g., a normally open vs. a normally closed switch application). Additional circuitry may be used to process the output 142 or isolate the output 142 before processing by a microprocessor of the controller 108, for example.

Figure 5:
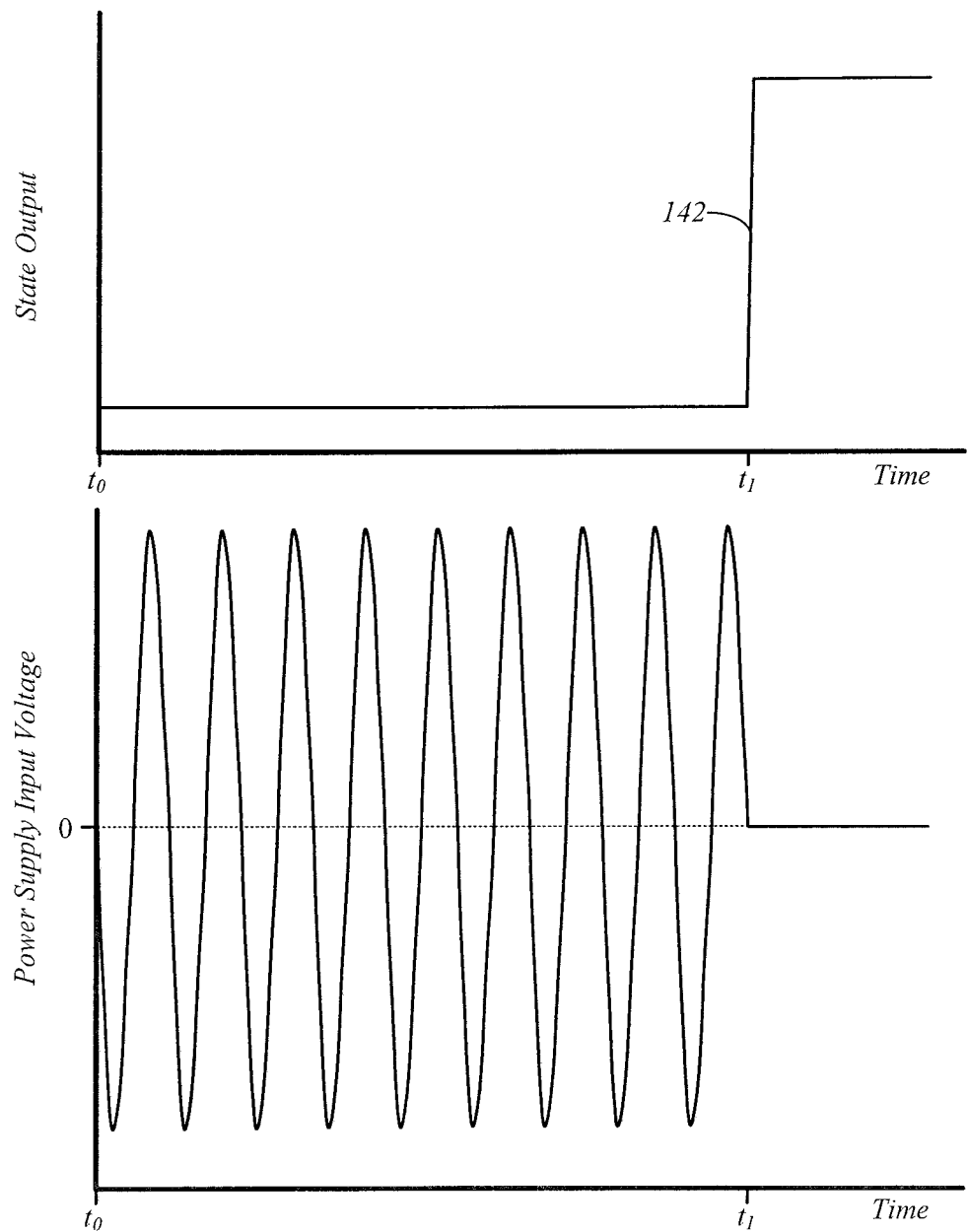
FIG. 5 illustrates a chart of an alternating current voltage delivered to a switch of a field device, and a chart of a state output generated by an exemplary switch monitor of an industrial process field device, in accordance with embodiments of the present disclosure.

FIG. 5 illustrates two charts comparing an AC voltage from the power supply 124 delivered to the switch 120 with the state output 142 generated by the exemplary switch monitor 140A of FIG. 3. During a time period $t_0$-$t_1$, the switch 120 is in the open state, and the voltage across the switch 120 mirrors the AC voltage supplied by the power supply 124. For this example, the switch monitor 140A produces a logic low state output 142 for the open state of the switch 120. At time $t_1$, the switch 120 is closed. This causes a current to flow through the switch 120 and to the device 126. Additionally, the voltage across the switch 120 drops substantially close to zero. This change in the voltage across the switch 120 results in the switch monitor 140A producing a logic high state output 142.

The exemplary switch monitor 140B (FIG. 4) is configured to produce the state output 142 based on a current $I_S$ (AC or DC) through the switch 120. The switch 140B is coupled to the terminals 152 and 154, which may be, for example, terminals of the terminal block 116, as shown in FIG. 2. The switch monitor 140B may include the voltage rectifier 160 formed by the diode 162 and the capacitor 164, which operates as described above.

The switch monitor 140B may include resistors 186, 188, 190 and 192 and an op-amp 194 having a positive power supply input coupled to a supply voltage Vs, and a negative power supply input coupled to electrical ground 195. The ratio of the resistors 186 and 190, and the resistors 188 and 192 set the gain for the op-amp 194 to detect the voltage difference across a resistor 196 that is in series with the switch 120. The resistances of the resistors 186, 188, 190 and 192 are set very large to prevent high currents from flowing through the switch 120 from damaging any low voltage electronics. The op-amp 194 outputs the state output 142 based on the voltage across the resistor 196 in response to the current $I_S$.

The state output 142 from the op-amp 194 of the switch monitor 140B is an analog voltage that is proportional to the current through the resistor 196. Using the known value of the resistor 196, and the analog voltage of the state output 142, the controller 108 can determined the current $I_S$. The current $I_S$ may then be compared to a setting to determine if the switch 102 (e.g., a normally open or a normally closed switch) is in the open or closed state. Additional circuitry may be used to process the output 142 or isolate the output 142 before processing by a microprocessor of the controller 108, for example.

Figure 6:
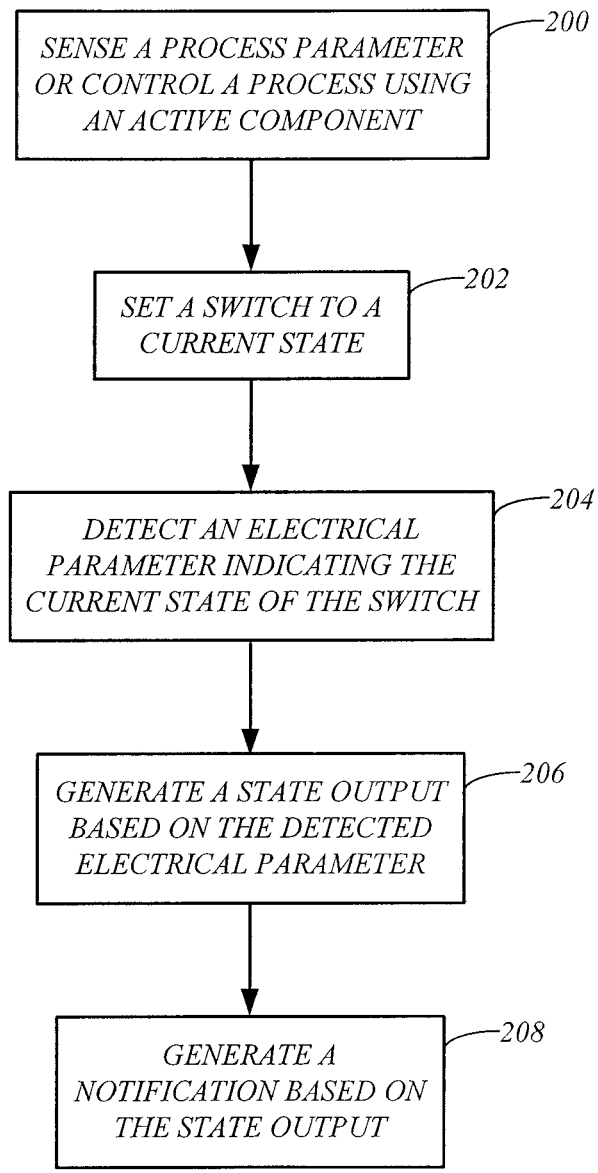
FIG. 6 is a flowchart illustrating a method of controlling an external device using an industrial process field device, in accordance with embodiments of the present disclosure.

Additional embodiments of the present disclosure are directed to methods of controlling an external device 126 using an industrial process field device 102, which is formed in accordance with one or more embodiments described herein. FIG. 6 is a flowchart illustrating one embodiment of the method.

At 200 of the method, a process parameter of an industrial process 104 is sensed, or the process 104 is controlled using an active component 110 of the field device 102. Thus, the active component may be in the form of a sensor that senses a process parameter, or a control device that controls a process, as discussed above.

At 202, a switch 120 of the field device 102 is set to a current state corresponding to either an open state, in which electrical power from an external power supply 124 is disconnected from the external device 126, or a closed state, in which electrical power from the external power supply 124 is connected to the external device 126. In some embodiments, the switch 120 is set to the current state in response to a switch drive signal 128 generated by a controller 108 of the field device 102, as discussed above.

At 204, an electrical parameter indicating the current state of the switch 120 is detected (i.e., sensed or measured) using a switch monitor 140 of the field device 102. As discussed above, embodiments of the electrical parameter include a voltage (AC or DC) across the switch 120 and a current (AC or DC) through the switch 120.

At 206, a state output 142 indicating the current state based on the detected electrical parameter is generated using the switch monitor 140. A notification is then generated at 208 based on the state output 142 using the controller 108. As discussed above, the notification 144 may indicate the current state of the switch 120, and/or whether the switch 120 is operating properly or not.

Although the embodiments of the present disclosure have been described with reference to preferred embodiments, workers skilled in the art will recognize that changes may be made in form and detail without departing from the spirit and scope of the present disclosure.

What is claimed is:

1. A field device for an industrial process comprising:
an active component selected from the group consisting of a sensor configured to sense a process parameter, and a control device configured to control a process of the industrial process;
a switch electrically coupled to first and second terminals and configured to electrically connect the first and second terminals when in a closed state, and electrically disconnect the first and second terminals when in an open state;
a switch monitor configured to detect a current state of the switch corresponding to one of the closed and open states, and generate a state output indicating the current state; and
a controller configured to set the switch in one of the open and closed states, and generate a notification based on the state output that indicates at least one of the current state of the switch and a condition of the switch;
wherein:
the switch monitor is configured to detect an electrical parameter indicating the current state of the switch selected from the group consisting of a voltage across the switch and a current through the switch, and generate the state output based on the detected electrical parameter;
the controller is configured to set the switch in the open or closed state using a switch drive signal;
the field device includes a comparator circuit; and
the controller generates the notification based on a comparison of the state output to the switch drive signal performed by the comparator circuit.

2. The field device of claim 1, wherein the notification includes or triggers a notification selected from the group consisting of an alarm, a status report on a display, an analog or digital communication, and a loop current setting of a process control loop.

3. The field device of claim 1, wherein the electrical parameter includes a direct current (DC) voltage and an alternating current (AC) voltage.

4. The field device of claim 1, wherein the electrical parameter includes an AC voltage, and the switch monitor includes a voltage rectifier configured to translate the AC voltage into a DC voltage at a node of the switch monitor.

5. The field device of claim 1, wherein the controller generates the notification based on a comparison of the state output to a switch setting indicating an intended state of the switch.

6. The field device of claim 1, wherein:
the controller is configured to set the switch in the open or closed state using a switch drive signal;
the active component comprises the sensor having a parameter output corresponding to a sensed process parameter; and
the controller is configured to set the switch in one of the open and closed states based on the parameter output using the switch drive signal.

7. The field device of claim 6, wherein:
the sensor is selected from the group consisting of a pressure sensor, a level sensor, a flow sensor, and a temperature sensor;
the device includes measurement circuitry configured to generate a parameter value based on the parameter output; and
the controller is configured to communicate the parameter value and the notification to a remote location using a communications circuit.

8. The field device of claim 1, wherein:
the controller is configured to set the switch in the open or closed state using a switch drive signal;
the active component comprises the control device, which is selected from the group consisting of an actuator, a valve, and a solenoid;
the control device includes at least two different states; and
the controller is configured to set the switch in one of the open and closed states based on the state of the control device using the switch drive signal.

9. An industrial process control system comprising:
a field device comprising:
an active component selected from the group consisting of a sensor configured to sense a process parameter, and a control device configured to control a process;
a switch electrically coupled to first and second terminals and configured to electrically connect the first and second terminals when in a closed state, and electrically disconnect the first and second terminals when in an open state;
a switch monitor configured to detect a current state of the switch corresponding to one of the closed and open states, and generate a state output indicating the current state; and
a controller configured to set the switch between the open and closed states, and generate a notification based on the state output that indicates at least one of the current state of the switch and a condition of the switch;
an external device electrically coupled to the switch through the first terminal; and
a power supply electrically coupled to the switch through the second terminal and configured to power the external device through the switch;
wherein:

power is supplied to the external device when the switch is in the closed state, and power is disconnected from the external device when the switch is in the open state;

the switch monitor is configured to detect an electrical parameter indicating the current state of the switch selected from the group consisting of a voltage across the switch and a current through the switch, and generate the state output based on the detected electrical parameter;

the controller is configured to set the switch in the open or closed state using a switch drive signal;

the field device includes a comparator circuit; and the controller generates the notification based on a comparison of the state output to the switch drive signal performed by the comparator circuit.

10. The system of claim 9, wherein the notification includes or triggers a notification selected from the group consisting of an alarm, a status report on a display, an analog or digital communication, and a loop current setting of a process control loop.

11. The system of claim 9, wherein the external device is selected from the group consisting of a pump, a solenoid, and a compressor.

12. The system of claim 9, wherein the controller generates the notification based on a comparison of the state output to a switch setting indicating an intended state of the switch.

13. The system of claim 9, wherein:

the active component comprises the sensor having a parameter output corresponding to a sensed process parameter; and the controller is configured to set the switch in one of the open and closed states based on the parameter output using the switch drive signal.

14. The system of claim 13, wherein:

the sensor is selected from the group consisting of a pressure sensor, a level sensor, a flow sensor, and a temperature sensor;

the device includes measurement circuitry configured to generate a parameter value based on the parameter output; and the controller is configured to communicate the parameter value and the notification to a remote location using a communications circuit.

15. A method of controlling an external device using an industrial process field device comprising:

sensing a process parameter of an industrial process or controlling the industrial process using an active component of the field device;

setting a switch of the field device to a current state corresponding to one of an open state, in which electrical power from an external power supply is disconnected from the external device, and a closed state, in which electrical power from the external power supply is connected to the external device, using a switch drive signal generated by a controller of the field device;

detecting an electrical parameter indicating the current state of the switch selected from the group consisting of a voltage across the switch and a current through the switch using a switch monitor of the field device;

generating a state output indicating the current state based on the detected electrical parameter using the switch monitor;

comparing the state output to the switch drive signal using a comparator circuit of the field device; and generating a notification based on the comparison using the controller that indicates at least one of the current state of the switch and a condition of the switch.

16. The method of claim 15, wherein:

generating the notification comprises comparing the state output to a switch setting indicating an intended state of the switch and generating the notification based on the comparison; and the notification includes or triggers a notification selected from the group consisting of an alarm, a status report on a display, an analog or digital communication, and a loop current setting of a process control loop.

17. The field device of claim 1, wherein the notification indicates the current state of the switch and the condition of the switch.

18. The system of claim 9, wherein the notification indicates the current state of the switch and/or a condition of the switch.

19. The system of claim 18, wherein the notification indicates the current state of the switch and the condition of the switch.

20. The method of claim 15, wherein the notification indicates the current state of the switch and the condition of the switch.

* * * * *